United States Patent [19]
Merrill

[11] Patent Number: 5,965,875
[45] Date of Patent: Oct. 12, 1999

[54] COLOR SEPARATION IN AN ACTIVE PIXEL CELL IMAGING ARRAY USING A TRIPLE-WELL STRUCTURE

[75] Inventor: Richard Billings Merrill, Woodside, Calif.

[73] Assignee: Foveon, Inc., Santa Clara, Calif.

[21] Appl. No.: 09/065,939

[22] Filed: Apr. 24, 1998

[51] Int. Cl.$^6$ .................................................. G01J 3/50
[52] U.S. Cl. .................. 250/226; 250/208.1; 250/214.1; 257/440
[58] Field of Search ............................... 250/226, 208.1, 250/214.1; 257/440, 458, 463

[56] References Cited

U.S. PATENT DOCUMENTS

| | | | |
|---|---|---|---|
| 3,971,065 | 7/1976 | Bayer ........................................ | 358/41 |
| 4,011,016 | 3/1977 | Layne et al. ............................. | 356/195 |
| 4,309,604 | 1/1982 | Yoshikawa et al. ..................... | 250/226 |
| 4,613,895 | 9/1986 | Burkey et al. ............................ | 358/41 |
| 4,651,001 | 3/1987 | Harada et al. ........................... | 250/330 |
| 4,677,289 | 6/1987 | Nozaki et al. ........................... | 250/226 |
| 4,772,335 | 9/1988 | Huang ..................................... | 257/458 |
| 5,397,734 | 3/1995 | Iguchi et al. ............................. | 437/70 |
| 5,502,299 | 3/1996 | Standley ............................... | 250/208.2 |
| 5,668,596 | 9/1997 | Vogel ...................................... | 348/222 |
| 5,739,562 | 4/1998 | Ackland et al. ......................... | 257/291 |

OTHER PUBLICATIONS

Stiebig, et al., Transient Behavior of Optimized nipiin Three–Color Detectors; IEEE Transactions on Electron Devices, vol. 45. No. 7; Jul. 1998, pp. 1438–1443.

Neaveau Niche Part I; The Latest In Digital SLRs; Shutterbug; Don Sutherland; pp. 200–210; Nov. 1997.

Studio Audience; High–End Digital Cameras Can Make Professional Indoor Photography A Snap; Buyer's Guide; Bob Weibel; pp. 311–317; Apr. 1997.

Enabling Technologies For A Family of Digital Cameras; SPIE; vol. 2654; Parulski et al.; pp. 156–163; 1996 (Month Unknown).

Technology and Device Scaling Considerations for CMOS Imagers; IEEE Transactions on Electron Devices; Hon–Sum Wong; vol. 43, No. 12; pp. 2131–2142; Dec. 1996.

Solid–State Imaging With Charge–Coupled Devices; Kluwer Academic Publishers; Albert J.P. Theuwissen; pp. 131–141; 1995 (Month Unknown).

Photosensitivity and Scanning of Silicon Image Detector Arrays; IEEE Journal of Solid–State Circuits; vol. SC–4, No. 6.; Savvas G. Chamberlain; pp. 333–342; Dec. 1969.

D. Knipp, et al.; Low Cost Approach to Realize Novel Detectors for Color Recognition; pp. 350–353 (No date).

Mohamed Ben Chouikha, et al.; Color Sensitive Photodetectors in Standard CMOS and BiCMOS Technologies; SPIE vol. 2950; pp. 108–120, Aug. 1996.

*Primary Examiner*—Que T. Le
*Attorney, Agent, or Firm*—Limbach & Limbach LLP

[57] ABSTRACT

A digital imager apparatus uses the differences in absorption length in silicon of light of different wavelengths for color separation. A preferred imaging array is based upon a three-color pixel sensor using a triple-well structure. The array results in elimination of color aliasing by measuring each of the three primary colors (RGB) in each pixel in the same location.

11 Claims, 9 Drawing Sheets

COLOR SEPARATION IN AN ACTIVE PIXEL CELL IMAGING ARRAY USING A TRIPLE-WELL STRUCTURE

BACKGROUND OF THE INVENTION

1. Field of the Invention

The present invention relates to color imaging and, more particularly, to color separation in an active pixel MOS imaging array using the differences in absorption length in silicon of light of different wavelengths. An active pixel imaging array in accordance with the present invention reduces color aliasing artifacts in digital images by using a triple-well structure to ensure that each pixel sensor in the array measures each of the three primary colors (R-G-B) in the same location.

2. Description of the Related Art

Relevant prior art of which the inventor is aware may be generally categorized as follows: stacked photodiodes as color sensors, imaging arrays with stacked sensors, and other color imaging array approaches.

The first category includes non-imaging devices for measuring the color of light. These devices have been built with a variety of technologies that depend upon the variation of photon absorption depth with wavelength. Examples are disclosed in U.S. Pat. No. 4,011,016, titled "Semiconductor Radiation Wavelength Detector" and U.S. Pat. No. 4,309,604, titled "Apparatus for Sensing the Wavelength and Intensity of Light." Neither patent discloses either a structure for a three-color integrated circuit color sensor or an imaging array.

The second category includes CCD devices with multiple buried channels for accumulating and shifting photocharges. These devices are difficult and expensive to manufacture and have not been practical for three-color applications. U.S. Pat. No. 4,613,895, titled "Color Responsive Imaging Device Employing Wavelength Dependent Semiconductor Optical Absorption" discloses an example. This category also includes devices that use layers of thin-film photosensitive materials applied on top of an imager integrated circuit. Examples of this technology are disclosed in U.S. Pat. No. 4,677,289, titled "Color Sensor" and U.S. Pat. No. 4,651,001, titled "Visible/Infrared Imaging Device with Stacked Cell Structure." These structures are also difficult and expensive to make, and have not become practical.

The third category includes color imaging integrated circuits that use a color filter mosaic to select different wavelength bands at different photosensor locations. U.S. Pat. No. 3,971,065, titled "Color Imaging Array", discloses an example of this technology.

As discussed by Parulski et al., "Enabling Technologies for Family of Digital Cameras", 156/SPIE Vo. 2654, 1996, one pixel mosaic pattern commonly utilized in digital cameras is the Bayer color filter array (CFA) pattern. Shown in FIG. 1, the Bayer CFA has 50% green pixels arranged in a checkerboard and alternating lines of red and blue pixels to fill in the remainder of the pattern.

As shown in FIG. 2, the Bayer CFA pattern results in a diamond-shaped Nyquist domain for green and smaller, rectangular-shaped Nyquist domains for red and blue. The human eye is more sensitive to high spatial frequencies in luminance than in chrominance, and luminance is composed primarily of green light. Therefore, since the Bayer CFA provides the same Nyquist frequency for the horizontal and vertical spatial frequencies as a monochrome imager, it improves the perceived sharpness of the digital image.

These mosaic approaches are known in the art to be associated with severe color aliasing problems due to the fact that the sensors are small compared to their spacing, so that they locally sample the image signal, and that the sensors for the different colors are in different locations, so that the samples do not align between colors. Image frequency components outside of the Nyquist domain are aliased into the sampled image with little attenuation and with little correlation between the colors.

Accordingly, it is an object of the present invention to provide a color imaging array in which three color bands are measured with detectors each in the same location, with sensitive areas that are not very small compared to their spacing, such that aliased image components are attenuated, and such that the color samples are aligned between colors.

It is a further object of the present invention to provide an active pixel color imaging array that can be fabricated in a standard modern CMOS memory process.

Referring to FIG. 3, many modern CMOS integrated circuit fabrication processes use a "twin well" or "twin tub" structure in which a P well region 10 and an N well region 12 of doping density approximately $10^{17}$ atoms/cm$^2$ are used as regions within which to make N-channel and P-channel transistors, respectively. The substrate material 14 is typically a more lightly doped P-type silicon ($10^{15}$ atoms/cm$^2$), so the P well 10 is not isolated from the substrate 14. The N-channel FET 16 formed in the P well 10 includes N+ normal source/drain diffusions 18 at a dopant concentration of $>10^{18}$ atoms/cm$^2$ and N-type shallow lightly doped drain (LDD) regions 20 at a concentration of approximately $10^{18}$ atoms/cm$^2$. The P-channel FET 22 formed in the N well region 12 is similarly constructed using normal P+ source/drain regions 24 and shallow LDD regions 26 of similar dopant concentrations.

Referring to FIG. 4, in improved modern processes, known as "triple well", an additional deep N isolation well 28 is used to provide junction isolation of the P well 10 from the P substrate 14. The N isolation well 28 dopant density ($10^{16}$ atoms/cc) is intermediate between the P substrate 14 and P well 10 dopant densities ($10^{15}$ atoms/cc and $10^{17}$ atoms/cc, respectively). U.S. Pat. No. 5,397,734, titled "Method of Fabricating a Semiconductor Device Having a Triple Well Structure", discloses an example of triple well technology.

Triple well processes are becoming popular and economical for manufacturing MOS memory (DRAM) devices, since they provide effective isolation of dynamic charge storage nodes from stray minority carriers that may be diffusing through the substrate.

SUMMARY OF THE INVENTION

The present invention is directed to color separation in an active pixel MOS imaging array utilizing a triple-well pixel cell structure to take advantage of the differences in absorption length in silicon of light of different wavelengths to measure different colors in the same location with sensitive areas almost as large as their spacing.

Accordingly, a preferred embodiment of the present invention provides a color photosensor structure formed in a P-type silicon substrate for separating blue, green and red light. The photosensor structure includes a deep N-doped region formed in the substrate such that the pn junction between the N-region and the substrate defines a red-sensitive photodiode at a depth in the substrate approximately equal to the absorption length of red light in silicon. A P-doped region is formed in the N-region such that the np junction between the P-region and the N-region defines a green-sensitive photodiode at a depth in the substrate approximately equal to the absorption length of green light in silicon. A shallow N-doped region is formed in the P-region such that the pn junction between the shallow N-region and the P-region defines a blue-sensitive photodiode at a depth in the substrate approximately equal to the absorption length of blue light. Sensing circuitry is connected to the red, green and blue photodiodes to measure respective photodiode currents.

A triple well process is useful in the present invention because it provides a practical way to fabricate the vertical PNPN device that is needed to make a triple stacked photodiode. The normal N well of the triple well process is not used in the pixel cell of the present invention, although it may be useful to use it on the same chip, outside of the array of imager cells. The deep N-doped region that is needed in the triple stacked photodiode is the one referred to above as the N isolation well.

The present invention reduces color aliasing artifacts by ensuring that all pixels in an imaging array measure red, green and blue color response in the same place in the pixel structure. Color filtration takes place by making use of the differences in absorption length in silicon of the red, green and blue light.

The present invention provides advantages in addition to reduction of color aliasing. For example, it eliminates the complex polymer color filter array process steps common in the prior art. Instead, a triple-well process, which is commonly available in the semiconductor industry is used. Also, overall efficiency of use for available photons is increased. With the traditional approach, photons not being passed by the filter material are absorbed in the filter and wasted. With the approach of the present invention, the colors are separated by absorption depth, but are all collected and used. This can result in an overall improvement in quantum efficiency in excess of three times.

The present invention provides an excellent example of an imager that would be difficult to implement with conventional CCD technology. In addition, the present invention benefits from the availability of scaled CMOS processing, in the sense that there are many support transistors in each three-color pixel.

A better understanding of the features and advantages of the present invention will be obtained by reference to the following detailed description and accompanying drawings which set forth illustrative embodiments in which the concepts of the invention are utilized.

DETAILED DESCRIPTION OF THE INVENTION

Figure 1:
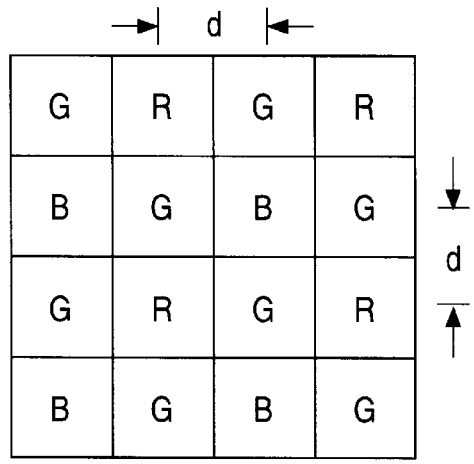
FIG. 1 illustrates s the well-known Bayer color filter array (CFA) pattern.
Figure 2:
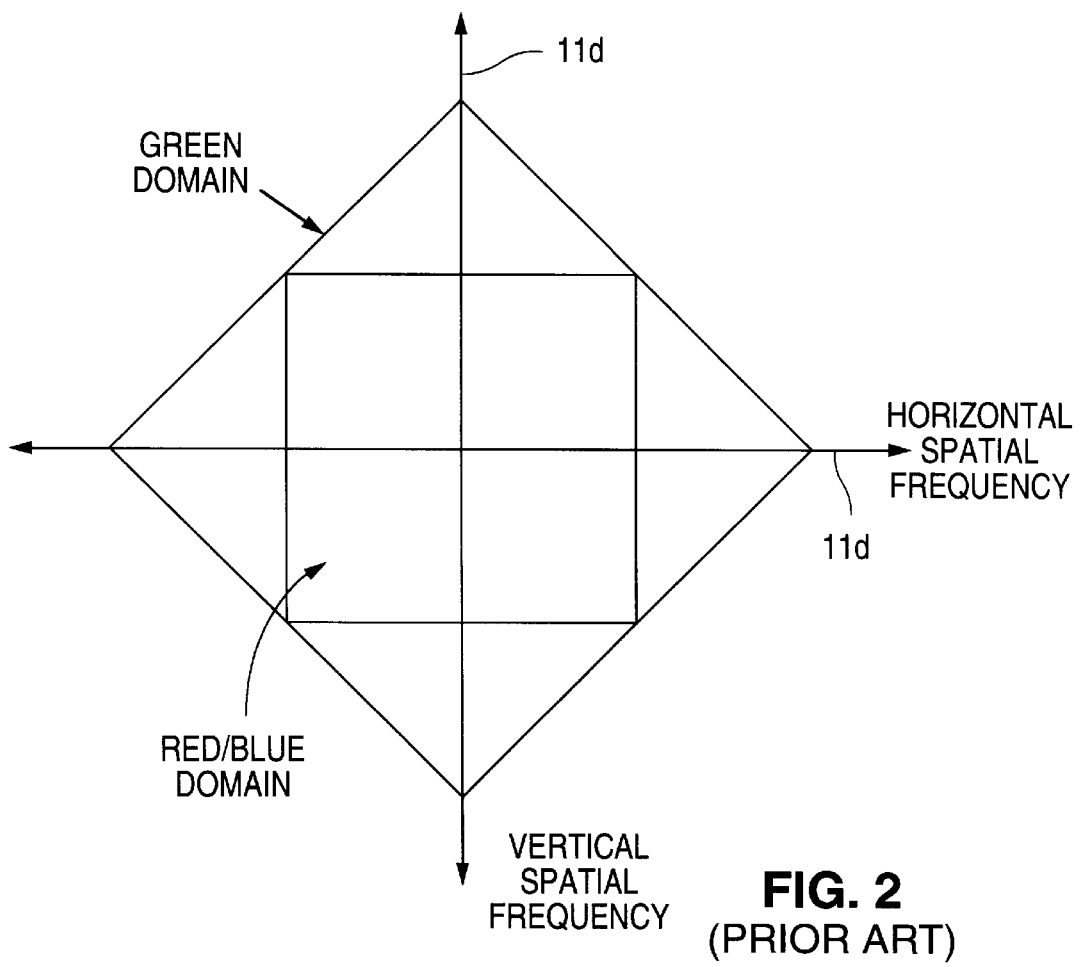
FIG. 2 illustrates the Nyquist domains for red, green and blue resulting from the Bayer CFA.
Figure 3:
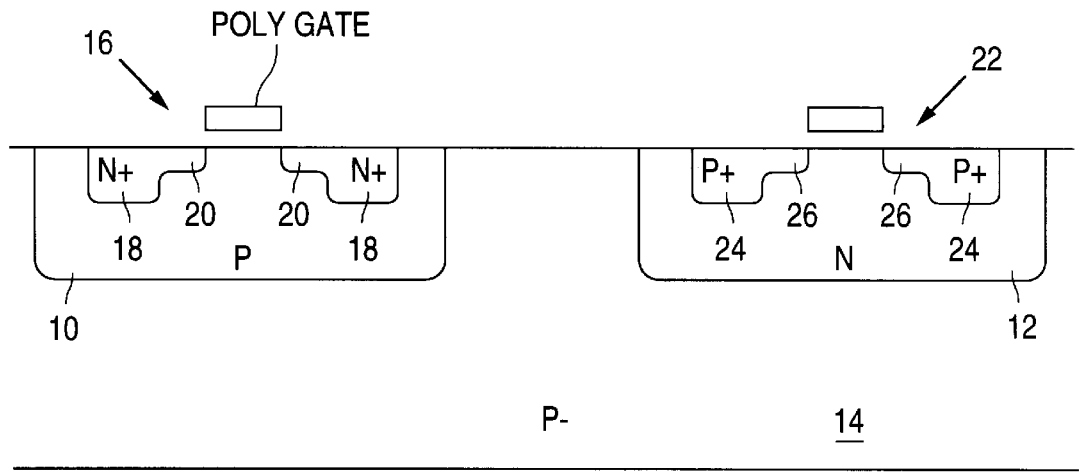
FIG. 3 is a partial cross-section drawing illustrating a conventional twin-well CMOS structure.
Figure 4:
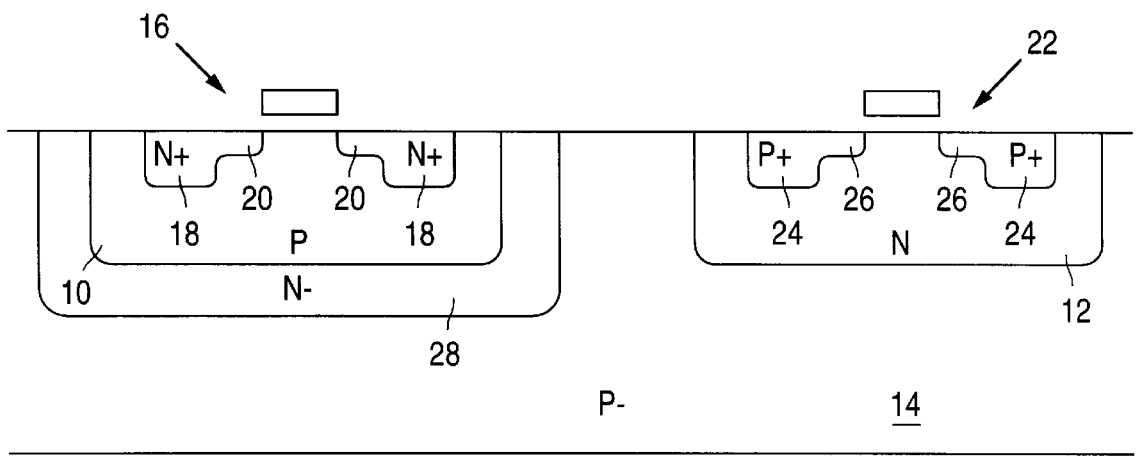
FIG. 4 is a partial cross-section drawing illustrating a conventional triple-well CMOS structure.
Figure 5:
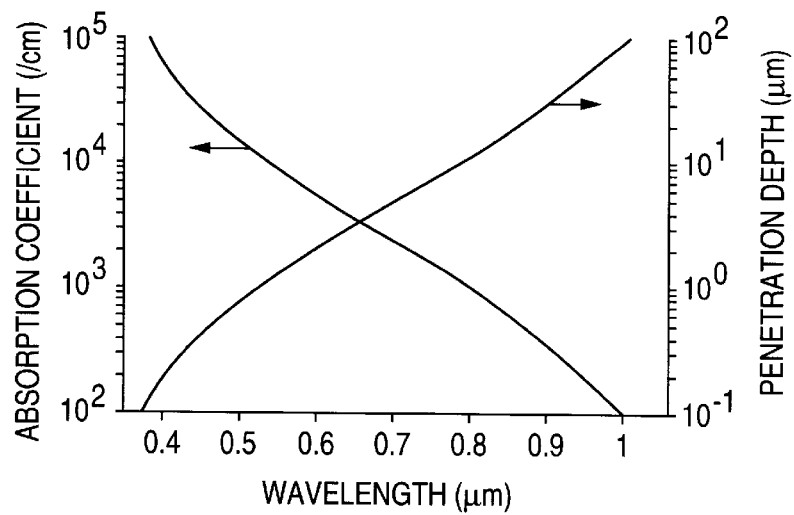
FIG. 5 is a graph plotting light absorption length in silicon versus wavelength.

It is well known that the greater the wavelength of light incident upon a silicon substrate, the deeper the light will penetrate into the silicon before it is absorbed. FIG. 5 shows light absorption length in silicon for light in the visible spectrum. As indicated in FIG. 5, blue light, having a wavelength of 400–490 nm, will be absorbed in a silicon substrate primarily at a depth of about 0.2–0.5 microns. Green light, having a wavelength of 490–575 nm, will be absorbed in the silicon substrate at a depth of about 0.5–1.5 microns. Red light, having a wavelength of 575–700 nm, will be absorbed in the silicon at a depth of about 1.5–3.0 microns.

Figure 6:
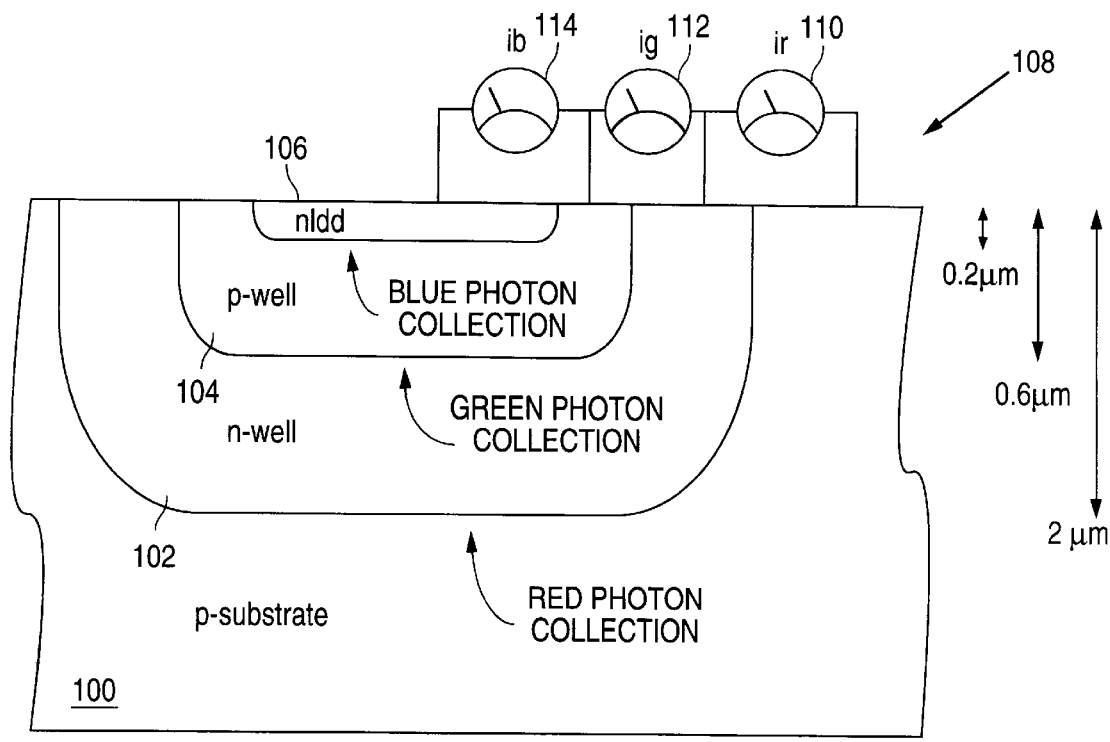
FIG. 6 is a partial cross-section drawing illustrating a three-color pixel sensor using a triple-well structure in accordance with the concepts of the present invention.

Taking advantage of these differences in absorption depth in silicon of light of different wavelength, as shown in FIG. 6, a preferred embodiment of the present invention provides a triple-well color photosensor structure formed in a silicon substrate 100 of P-type conductivity (approx. $10^{15}$ atoms/cm$^2$). The color photosensor structure includes a deep N-type doped well region 102 (approx. $10^{16}$ atoms/cm$^2$) formed in the P-type silicon substrate 100. The junction depth of the N-doped region 102 is between about 1.5–3.0 microns, and preferably about 2 microns, i.e. the approximate absorption depth of red light. Thus, the pn junction between the deep N-doped region 102 and the P-type substrate 100 forms a red-sensitive photodiode between the two regions.

Similarly, a doped well region 104 of P-type conductivity (approx. $10^{17}$ atoms/cm$^2$) is formed in the N-doped region 102. The pn junction between the P-doped region 104 and the N-doped 102 is formed at a depth between about 0.5–1.5 micron, and preferably about 0.6 microns, i.e. the approximate absorption length of green light in silicon. Thus, the pn junction between the P-region 104 and the deep N-region 102 forms a green-sensitive photodiode between the two regions.

As further shown in FIG. 6, a shallow doped region 106 of N-type conductivity (approx. $10^{18}$ atoms/cm$^2$) is formed in the P-doped region 104 to a depth between about 0.2–0.5 microns, and preferably about 0.2 microns, i.e. the absorption length of blue light in silicon. Thus, the pn junction between the shallow N-doped region 106 and the P-region 104 forms a blue-sensitive photodiode.

Those skilled in the art will appreciate that, as indicated above, the sensitive depletion region of the diodes described above extends somewhat above and below the junction depth.

Those skilled in the art will also appreciate that the above-described triple-well structure can be implemented using opposite conductivities, i.e. a deep P-doped region in an N-substrate, an N-doped region in the deep P-region and a shallow P-doped region in the N-region. However, this structure is usually not used in the industry, the FIG. 6 structure being preferred since it uses standard MOS memory technology.

FIG. 6 further shows that the color photosensor structure also includes a sensing mechanism 108 connected to the red, green and blue photodiodes for measuring red, green and blue photocurrents, respectively, across the three photodiodes.

FIG. 6 shows a conceptual arrangement of a photocurrent sensor 108 that includes a first current meter 110 connected across the red photodiode for measuring the red photocurrent ir. A second current meter 112 is connected across the green photodiode for measuring the green photocurrent ig. A third current meter 114 is connected across the blue photodiode for measuring the blue photocurrent ib.

Assuming that most of the current in the photodiodes is collected in the depletion region, those skilled in the art will clearly appreciate that the current ib will consist mostly of photocurrent of incident photons from the blue end of the visible spectrum; current ig will be mostly current from green photons; and current ir will reflect current from red photons.

As shown in FIG. 6, an isolated P-well process is assumed and the surface junction is shown as a very shallow nldd (N-type lightly doped drain) layer to maximize blue response.

Figure 7:
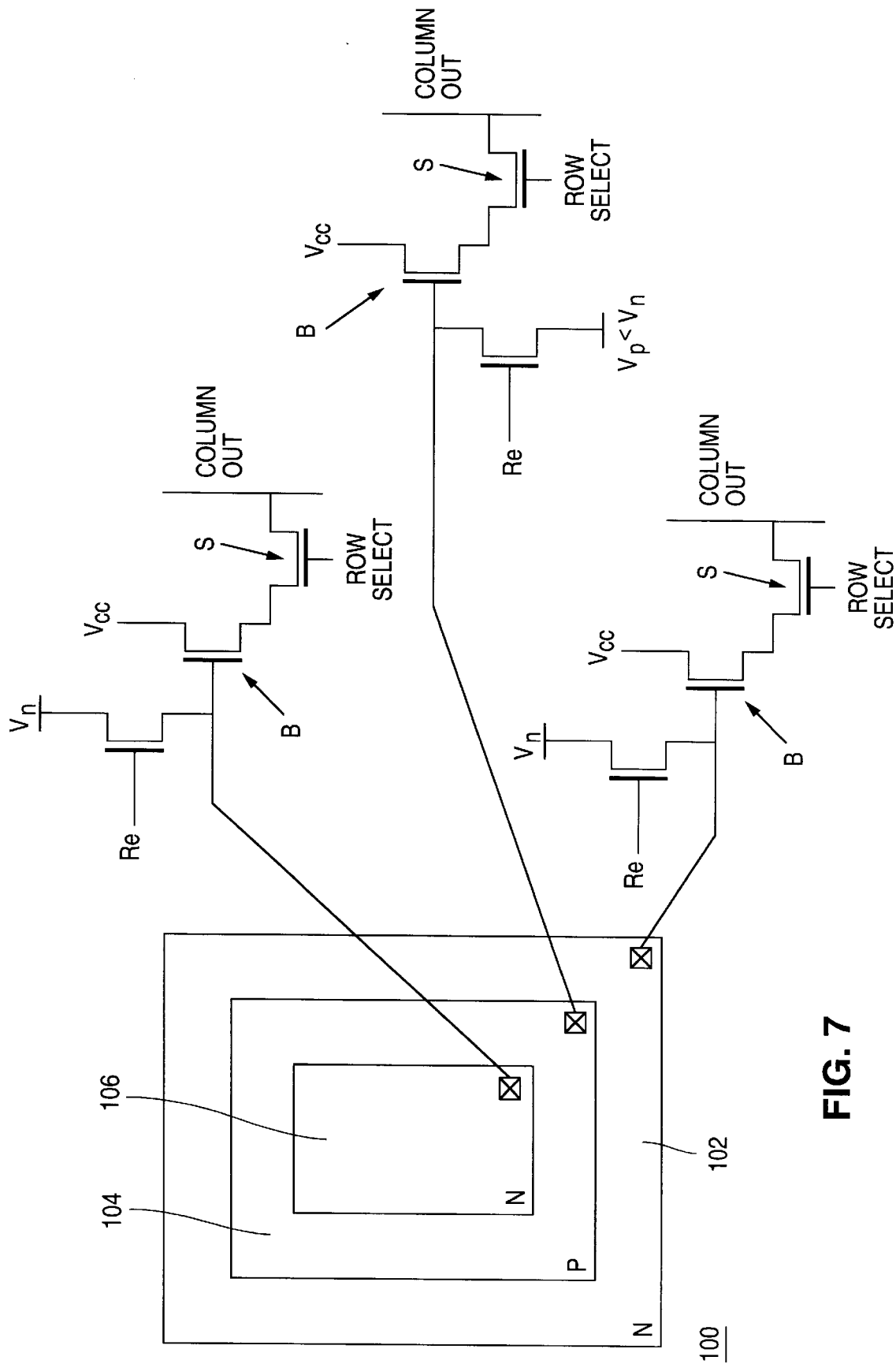
FIG. 7 is a plan view of the FIG. 6 three-color pixel sensor structure in combination with schematic diagrams illustrating an embodiment of associated photocurrent sensing circuitry.

FIG. 7 shows an approximation of the layout of the above-described triple-well photosensor structure. Those skilled in the art will appreciate that, while the triple-well structure may be larger than a single prior art pixel sensor cell, the area of the FIG. 7 pixel must be compared to three conventional pixel cells due to the mixed-color nature of the conventional pixel array pattern.

It is common in the art to use an "active pixel" circuit in conjunction with a photodiode. FIG. 7 shows schematics for three such photocurrent sensing circuits, one for each photodiode. In the FIG. 7 embodiment, these circuits are conventional three-transistor current sensors (those skilled in the art will appreciate that other current sensor circuits may also be utilized). The active pixel circuit senses photocharge by integrating photocurrent on the capacitance of the photodiode and the associated circuit node and then buffering the resulting voltage through a readout amplifier.

As stated above, three transistors are typically used: a reset transistor (Re) resets the voltage on the capacitor to a reference level indicative of a dark state. A source follower amplifier transistor B buffers the voltage on the photodiode. A select transistor S connects a cell to a column output line when the row that the cell is in is selected for readout.

As shown in FIG. 7, in the case of the stacked back-to-back triple photodiodes of the present invention, the reset potentials ($V_n$) of two of the diode nodes are substantially positive with respect to the P substrate, and the reset potential ($V_p$) of the middle node is less positive (i.e. $V_n > V_p$), so that all three diodes start out in a reverse biased state. As the photodiodes are exposed to light, they become less reverse biased, and can even become somewhat forward biased before they "overflow." The three voltages sensed will correspond to different linear combinations of the photocharges, depending on the values of the various photodiodes and stray capacitances of the circuit. These linear combinations affect the resulting sensitivity curves for the voltage output and, hence, are corrected for in the matrix transformation that follows to produce a calorimetrically sensible final output.

Figure 8:
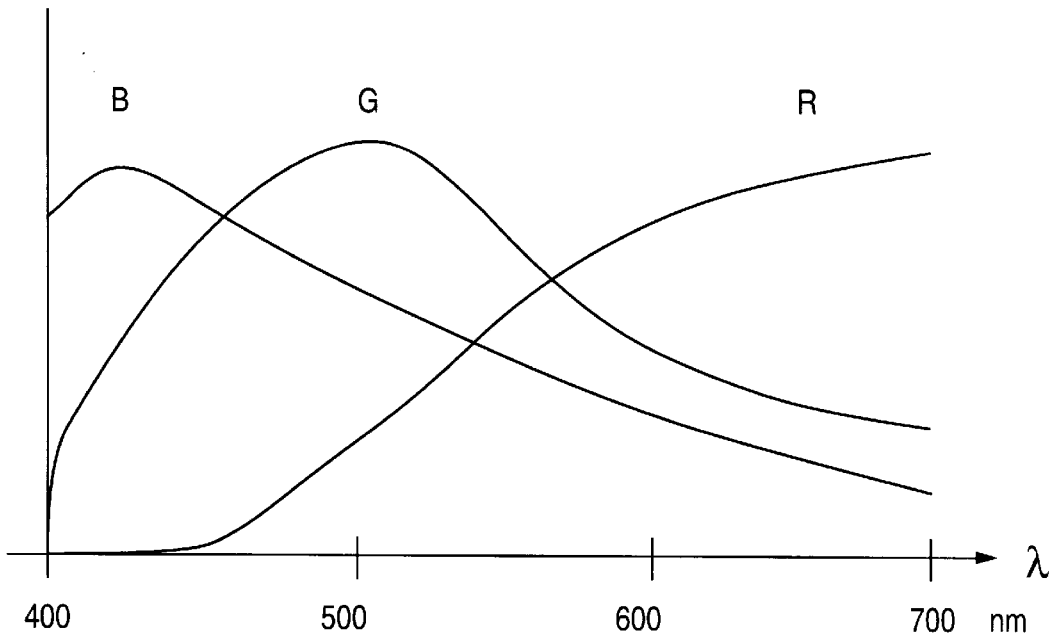
FIG. 8 is a graph showing a set of estimated sensitivity curves for the FIG. 6 triple-well photodiode structure in accordance with the present invention.

FIG. 8 shows a set of estimated sensitivity curves for the triple stacked photodiode arrangement of the present invention, as a function of wavelength within the visible spectrum. The curves are only rather broadly tuned, as shown, rather than sharply tuned as in some other color separation approaches that are based on color filters. However, as is well known in the art of color imaging, it is possible with suitable matrixing to convert three measurements from such a set of curves into a more nearly calorimetrically correct set of red, green, and blue intensity values. Methods for estimating suitable matrix transformations are known in the art, for example in U.S. Pat. No. 5,668,596, titled "Digital Imaging Device Optimized for Color Performance."

The triple-photodiode color sensor structure described above in conjunction with FIG. 6, and its associated photocurrent sensing circuitry, for example as described above in conjunction with FIG. 7, may be utilized in providing an active pixel cell imaging array based on a triple-well structure. Such an imaging array includes a matrix of rows and columns of photocells, with each photocell including the triple-well structure and associated photosensing circuitry. Each row of the matrix has three read select lines associated therewith, connected to each photosensing circuit in that row in the manner shown, for example, in FIG. 7. Similarly, each column of the matrix has three column output lines associated therewith, connected to each photosensing circuit in that column in the manner shown, for example, in FIG. 7.

However, in an imaging array in accordance with the present invention, the three row select lines and the three column output lines of each photocell do not all have to be brought out separately, as shown in FIG. 7.

Figure 9:
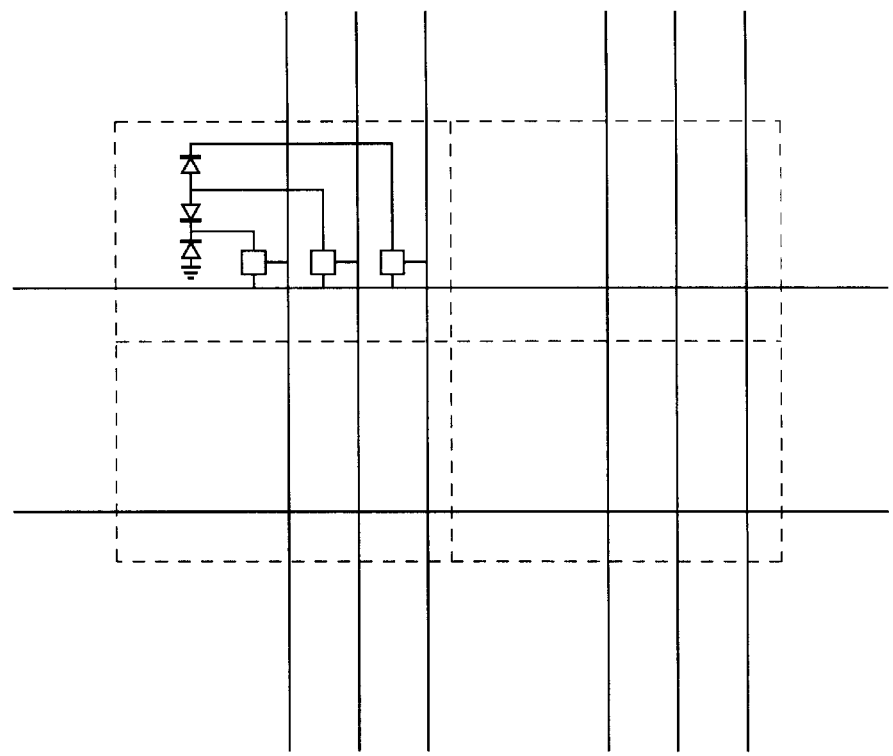
FIG. 9 is a partial schematic diagram illustrating a portion of an imaging array in accordance with the present invention in which the photodiodes and readout amplifier circuits of each cell are arranged in the array with one row select line and three column output lines per cell.
Figure 10:
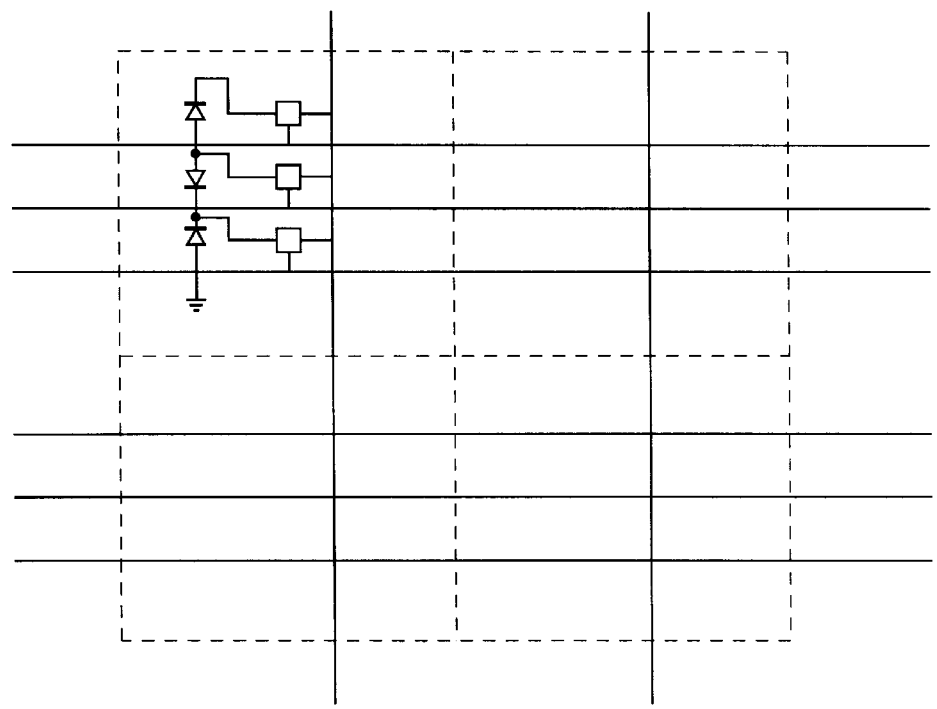
FIG. 10 is a partial schematic diagram illustrating a portion of an imaging array in accordance with the present invention in which the photodiodes and readout amplifier circuits of each cell are arranged in the array with three row select lines and one column output line per cell.

Alternatively, the three color sensors and readout amplifiers can be wired as short portions of either rows or columns, by connecting either the row select lines in common or the column output lines in common, as shown in FIGS. 9 and 10, respectively. In FIGS. 9 and 10, signal lines that are common to all cells in the array, such as reset and power supply signals, are not shown.

Figure 11:
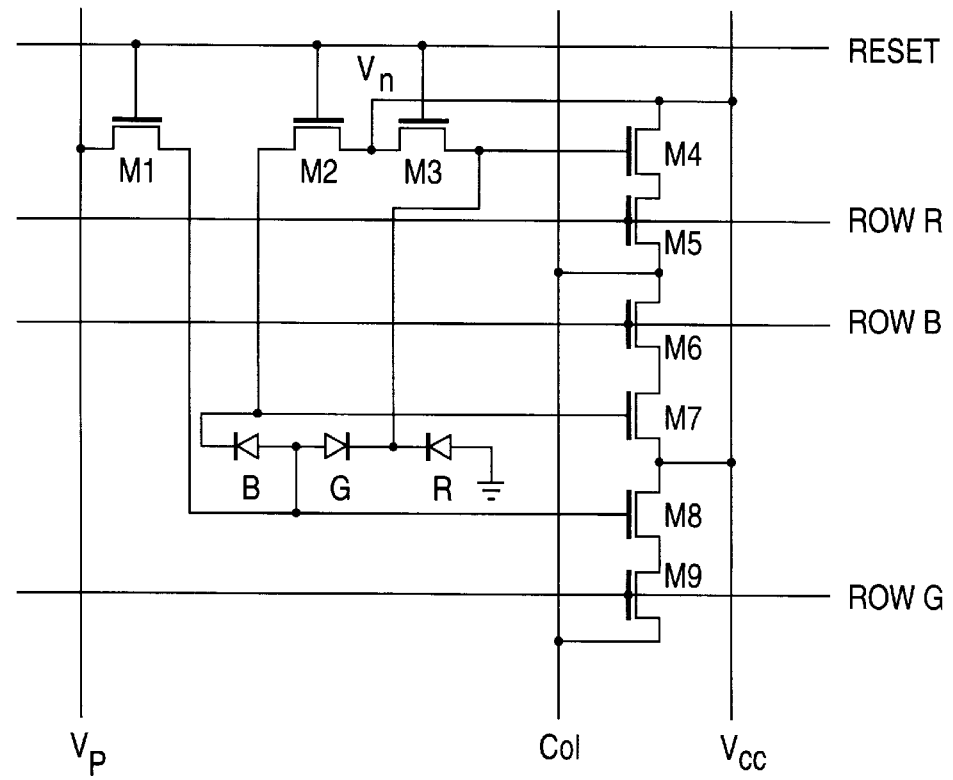
FIG. 11 is a schematic diagram illustrating an embodiment of the FIG. 10 pixel sensor cell having three row select lines and one column output line.
Figure 12A:
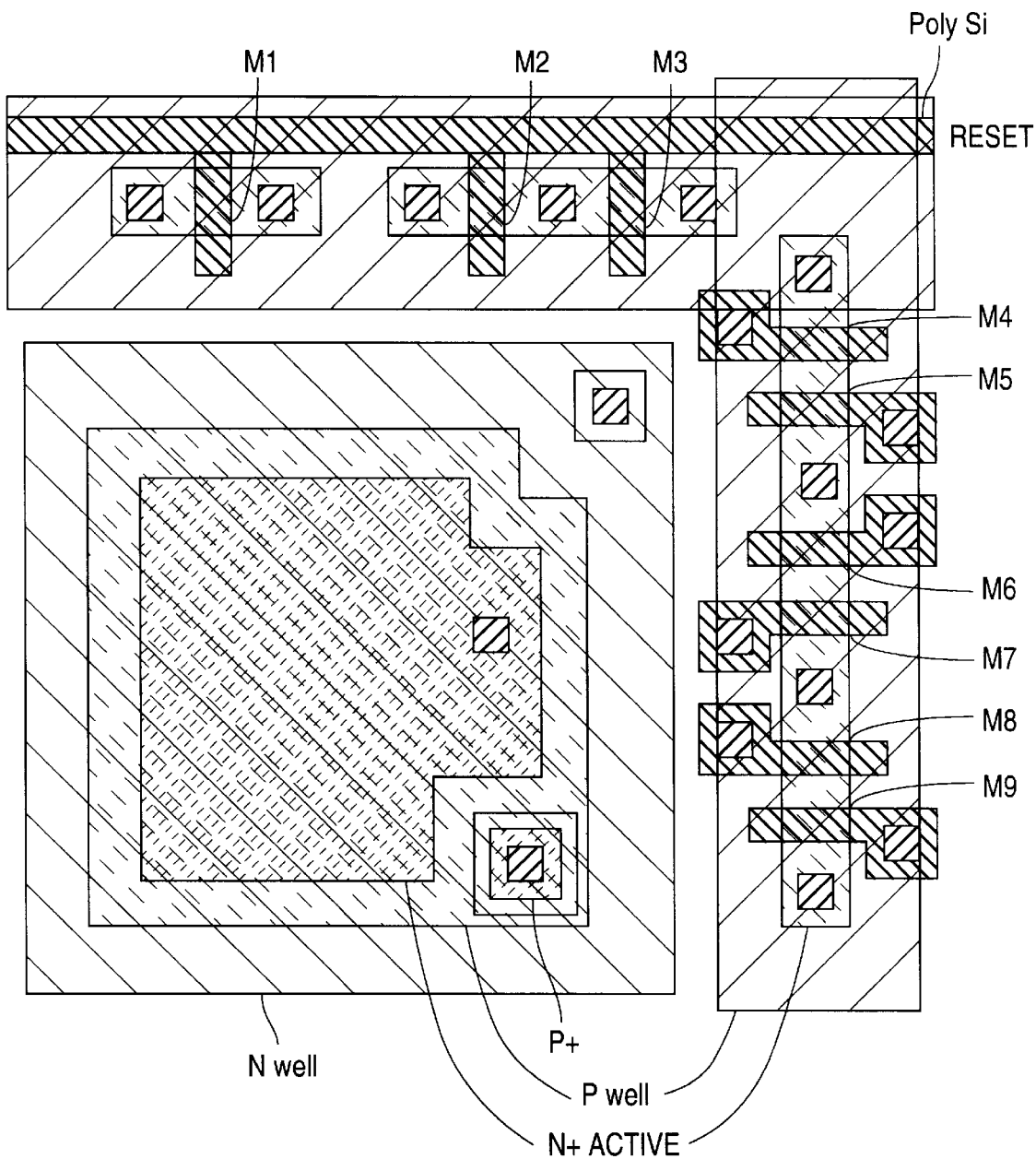
FIG. 12A is a layout drawing illustrating the silicon layers of the FIG. 11 cell, up to and including contacts from silicon to first metal.

FIG. 11 shows a complete schematic diagram for a pixel according to the array scheme of FIG. 10, having three row select lines RowR, RowG, and RowB, for the red, green, and blue sensor measurement/readout structures, respectively, and a common column output line. The FIG. 11 schematic is arranged such that the positions and orientations of the MOS transistors M1 through M9 agree with their positions and orientations in the layout, which is shown in FIGS. 12A/12B. In this embodiment, the readout supply Vcc and the reset reference voltage Vn of FIG. 7 are shared, while Vp is kept separate.

Figure 12B:
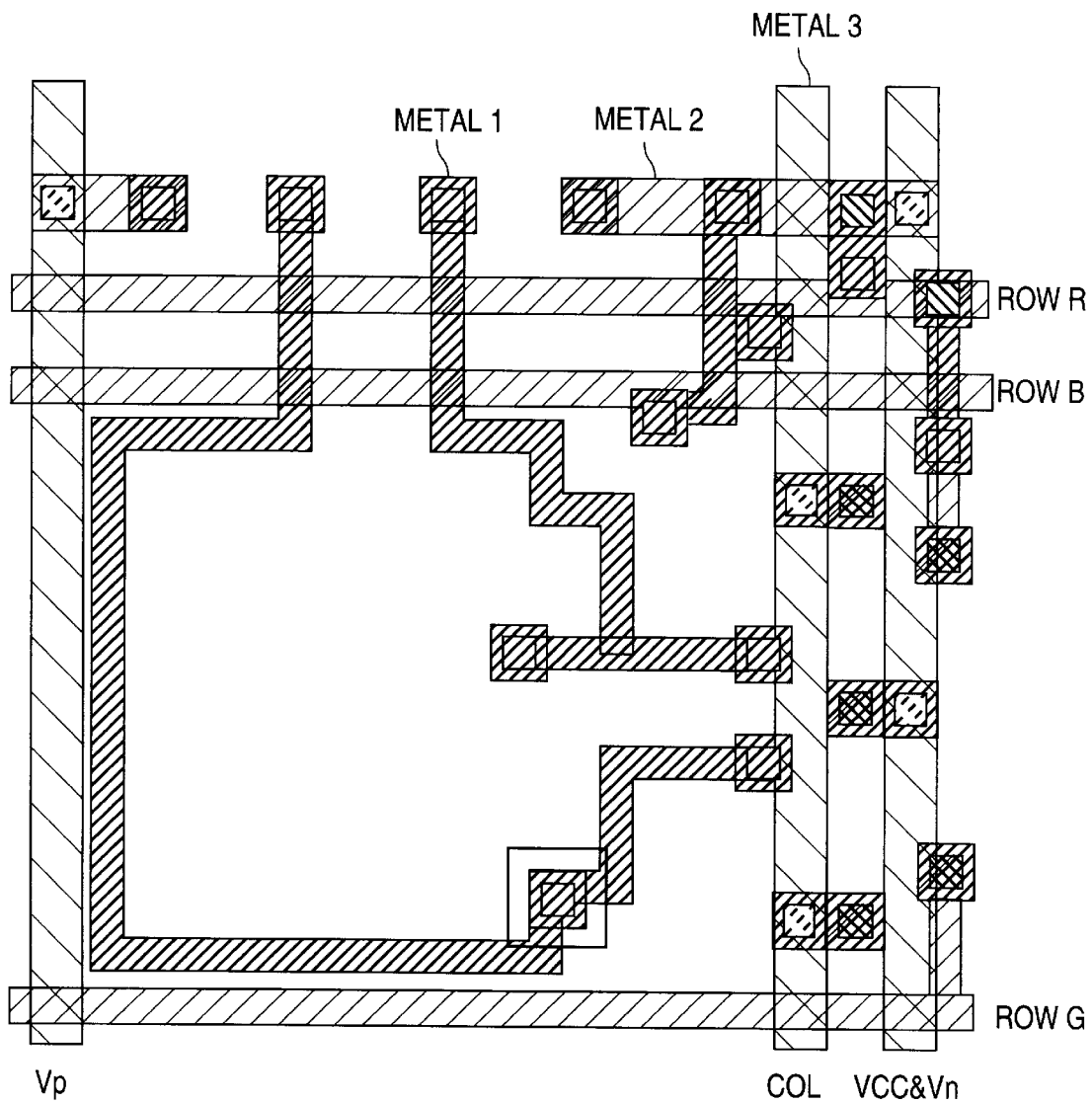
FIG. 12B is a layout drawing illustrating the three metal interconnect layers of the FIG. 11 cell, including contacts and vias.

FIGS. 12A/12B show an experimental layout of the FIG. 11 circuit, using stipple patterns for mask layers separated into two sets, for drawing clarity. FIG. 12A shows the mask layers that affect the silicon—active areas, wells, implants, polysilicon gates, and contact cuts—as will be immediately clear to a person of ordinary skill in the art. FIG. 12B shows the contact cuts and three metal interconnect and two via mask layers. As shown in FIGS. 12A/12B, metal 1 is used for intra-pixel interconnect, metal 2 for row lines, metal 3 for column lines, and polysilicon for the row reset line. A fourth layer of metal would preferably be used as a light shield to allow light to fall only on the photodiodes, but is not shown in the figure.

A person of ordinary skill in the art of active pixel sensors will realize that the reset function is often connected by rows, enabling a scrolling type electronic shutter timing wherein the pixels in a row are reset a certain time before the corresponding row is to be read out, as opposed to a global reset function. Therefore, the pixel array preferably wires the reset line horizontally as in the embodiment of FIGS. 12A/12B. It will also be recognized that when cells of the illustrated layout are abutted in an array, the P well that the transistors are in will completely surround the stacked photodiodes; pixels on the extreme left and lower edges can preferably be completed by a strip of P well outside the array.

Figure 13A:
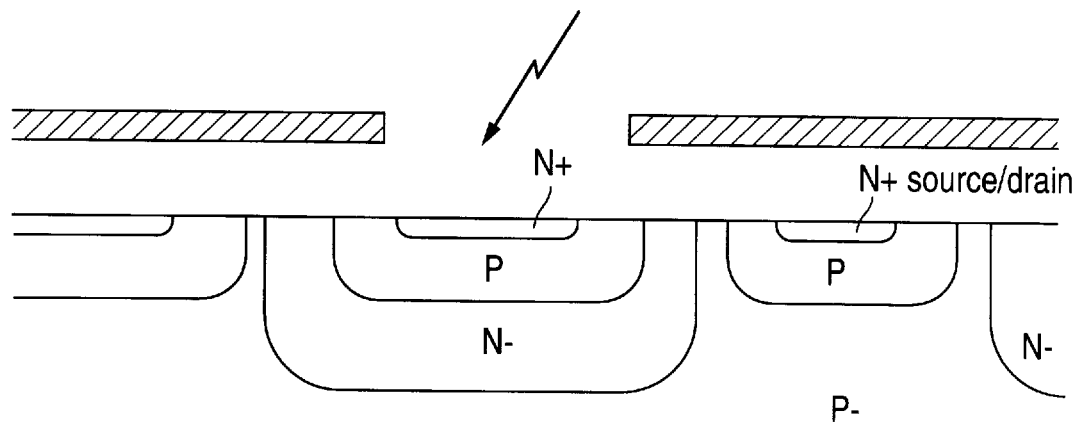
FIG. 13A is a cross-section drawing illustrating an ideal silicon surface of the FIGS. 12A/12B cell, plus an upper metal light shield layer.

FIGS. 13A/13B show cross-sections through the center of the pixel, according to the layout of FIG. 12, including the underlying doped regions of the silicon, and including a light shield but omitting intermediate layers of metal interconnect and oxides; a portion of the next cell to the left is included.

FIG. 13A shows the idealized wells, and illustrates the fact that a standard triple-well CMOS process can be used to define the P well in the photosensor and the P well in the readout circuits with the same masking and fabrication steps. Similarly, the shallow N+ doped region in the photosensor can be made by the same masking and fabrication steps as the N+ source/drain regions of the readout circuits. These N+ regions can be either the standard strongly N+ doped active regions of the CMOS process, or the NLDD lightly doped drain regions, depending on an experimental design choice (the cross section can be interpreted as being through either part of the source/drain region).

Figure 13B:
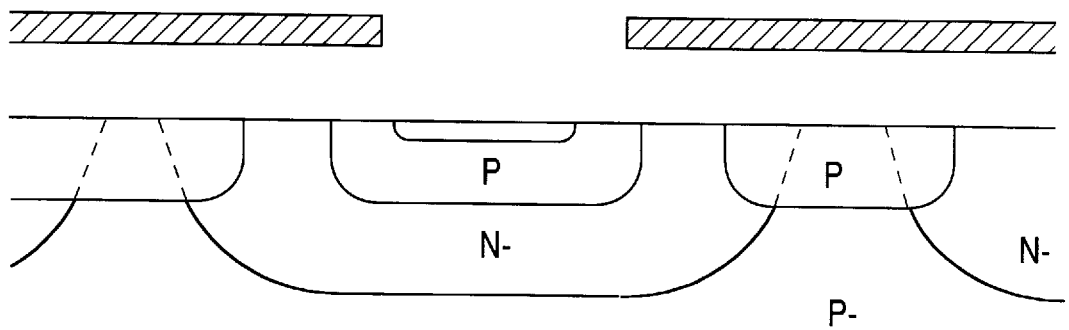
FIG. 13B is a cross-section drawing illustrating the silicon surface of the FIGS. 12A/12B cell with N-region outdiffusion, plus an upper metal light shield layer.

FIG. 13B shows what the doped regions in the pixel might look like with a moderate degree of outdiffusion of the N-well implant. The present invention, by integrating the stacked photosensors with the active pixel sensing and readout electronics in CMOS, allows the P well that the readout electronics is built in to serve as an effective isolation barrier between the deep N wells. As shown in FIG. 13B, the N wells are spaced so that they do not quite outdiffuse so much as to change the spaces between them from P to N, even if there were no intervening P well or active pixel sensing and readout circuitry. That is, the N wells could not be placed any closer together without risking a shorting of the red-sensitive photodiodes to their neighbors. The P well strip between the N well photodiodes serves to isolate them even more securely, while providing a "free" area in which N-type field-effect transistors can be built to serve as sensing and readout electronics. This novel combination of stacked silicon photodiodes with CMOS circuitry in a triple-well CMOS process therefore provides a surprising and compelling advantage over techniques known in the prior art.

It should be understood that various alternatives to the embodiments of the invention described herein may be employed in practicing the invention. It is intended that the following claims define the scope of the invention and that methods and structures within the scope of these claims and their equivalents be covered thereby.

What is claimed is:

1. A color photosensing structure formed in a silicon substrate of a first conductivity type for separating light of differing wavelengths, the color photosensor structure comprising:
   a first doped region of a second conductivity type opposite the first conductivity type formed in the silicon substrate, the junction between the first doped region and the silicon substrate being formed at a depth in the silicon substrate of about the absorption length in silicon of a first light wavelength to define a first photodiode;
   a second doped region of the first conductivity type formed in the first doped region, the junction between the second doped region and the first doped region being formed at a depth in the first doped region of about the light absorption length in silicon of a second light wavelength to define a second photodiode;
   a third doped region of the second conductivity type formed in the second doped region, the junction between the third doped region and the second doped region being formed at a depth in the second doped region of about the light absorption length in silicon of a third light wavelength to define a third photodiode; and
   a photocurrent sensor connected to measure first, second and third photocurrents across the first, second and third photodiodes, respectively.

2. A color photosensing structure as in claim 1, and wherein
   the junction between the first doped region and the silicon substrate is formed at a depth in the silicon substrate of about 1.5–3.0 microns;
   the junction between the second doped region and the first doped region is formed at a depth in the first doped region of about 0.5–1.5 microns; and
   the junction between the third doped region and the second doped region is formed at a depth in the second doped region of about 0.2–0.5 microns.

3. A color photosensing structure as in claim 1, and wherein
   the junction between the first doped region and the silicon substrate is formed at a depth in the silicon substrate of about 2.0 microns;
   the junction between the second doped region and the first doped region is formed at a depth in the first doped region of about 0.6 microns; and
   the junction between the third doped region ad the second doped region is formed at a depth in the second doped region of about 0.2 microns.

4. A color photosensor structure formed in a silicon substrate of P-type conductivity for separating light of blue, green and red wavelength, wherein light of blue, green and red wavelength has respective first, second and third light absorption lengths in silicon, the color photosensor structure comprising:
   a first deep region of N-type conductivity formed in the P-type silicon substrate, the junction between the deep N-type region and the P-type silicon substrate being formed at a depth in the P-type silicon substrate of about the third light absorption length to define a red photodiode;
   a second region of P-type conductivity formed in the deep N-type region, the junction between the P-type region and the deep N-type region being formed at a depth in the deep N-type region of about the second light absorption length to define a green photodiode;

a third shallow region of N-type conductivity formed in the P-type region, the junction between the shallow N-type region and the P-type region being formed in the P-type region of about the first light absorption length to define a blue photodiode; and photocurrent sensing means connected across the red, green and blue photodiodes for measuring red, green and blue photocurrents across the red, green and blue photodiodes, respectively.

5. An active pixel imaging array, the array comprising:
(a) a matrix of rows and columns of color photosensor structures formed in a silicon substrate having a first conductivity type, each color photosensor structure including:
  (i) a first doped region of a second conductivity type opposite the first conductivity type formed in the silicon substrate, the junction between the first doped region and the silicon substrate being formed at a depth in the silicon substrate of about the absorption length in silicon of a first light wavelength to define a first photodiode;
  (ii) a second doped region of the first conductivity type formed in the first doped region, the junction between the second doped region and the first doped region being formed at a depth in the first doped region of about the light absorption length in silicon of a second light wavelength to define a second photodiode;
  (iii) a third doped region of the second conductivity type formed in the second doped region, the junction between the third doped region and the second doped region being formed at a depth in the second doped region of about the light absorption length in silicon of a third light wavelength to define a third photodiode; and
  (iv) a photocurrent sensor connected to measure first, second and third photocurrents across the first, second and third photodiodes, respectively;
(b) for each row in said matrix, row select circuitry connected to each of the color photosensor structures in said row for selectively designating for outputting output signals representative of the first, second and third photocurrents generated in color photosensor structures in said row; and
(c) for each column in said matrix column output circuitry connected to each of the color photosensor structures in said column for selectively outputting output signals representative of the first, second and third photocurrents generated in color photosensor structures in said column.

6. An active pixel imaging array as in claim 5, and wherein
the junction between the first doped region and the silicon substrate is formed at a depth in the silicon substrate of about 1.5–3.0 microns;
the junction between the first second doped region and the first doped region is formed at a depth in the first doped region of about 0.5–1.5 microns; and
the junction between the third doped region and the second doped region is formed at a depth in the second doped region of about 0.2–0.5 microns.

7. An active pixel imaging array as in claim 5, and wherein the junction between the first doped region and the silicon substrate is formed at a depth in the silicon substrate of about 2.0 microns;
the junction between the second doped region and the first doped region is formed at a depth in the first doped region of about 0.6 microns; and
the junction between the third doped region and the second doped region is formed at a depth in the second doped region at about 0.2 microns.

8. An active pixel imaging array as in claim 5, and wherein:
said row select circuitry comprises a row select line connected to the photocurrent sensor of each color photosensor structure in said row for designating the first second and third photocurrents for output; and
said column output circuitry comprises first, second and third column output lines connected to the photocurrent sensor of each color photosensor structure in said column for outputting the first, second and third photocurrents, respectively.

9. An active pixel imaging array as in claim 5, and wherein:
said row select circuitry comprises first, second and third row select lines connected to the photocurrent sensor of each color photosensor structure in said row for designating the first, second and third photocurrents, respectively for output; and
said column output circuitry comprises a column output line connected to the photocurrent sensor of each color photosensor structure in said column for outputting the first, second and third photocurrents.

10. A color photosensor structure formed in a silicon substrate of a first conductivity type for separating light of differing wavelengths, the color photosensor structure comprising:
a first doped region of a second conductivity type opposite the first conductivity type formed in the silicon substrate, the junction between the first doped region and the silicon substrate being formed at a depth in the silicon substrate of about the absorption length in silicon of a first light wavelength to define a first photodiode;
a second doped region of the first conductivity type formed in the first doped region, the junction between the second doped region and the first doped region being formed at a depth in the first doped region of about the light absorption length in silicon of a second light wavelength to define a second photodiode;
a third doped region of the second conductivity type formed in the second doped region, the junction between the third doped region and the second doped region being formed at a depth in the second doped region of about the light absorption length in silicon of a third light wavelength to define a third photodiode;
a fourth doped region of the first conductivity type, having substantially the same dopant concentration as the second doped region, formed in the silicon substrate and completely surrounding the first doped region; and
a plurality of field effect transistors of the second conductivity type formed in the fourth doped region and interconnected to provide a photocurrent sensor for measuring first, second and third photocurrents across the first, second and third photodiodes, respectively.

11. An active pixel imaging array, the array comprising:
(a) a matrix of row and columns of color photosensor structures formed in a silicon substrate having a first conductivity type, each color photosensor including:

(i) a first doped region of a second conductivity type opposite the first conductivity type formed in the silicon substrate, the junction between the first doped region and the silicon substrate being formed at a depth in the silicon substrate of about the absorption length in silicon of a first light wave length to define a first photodiode;

(ii) a second doped region of the first conductivity type formed in the first doped region, the junction between the second doped region and the first doped region being formed at a depth in the first doped region of about the light absorption length in silicon of a second light wavelength to define a second photodiode;

(iii) a third doped region of the second conductivity type formed in the second doped region, the junction between the third doped region and the second doped region being formed at a depth in the second doped region of about the light absorption length in silicon of a third light wavelength to define a third photodiode;

(iv) a fourth doped region of the first conductivity type, having substantially the same dopant concentration as the second doped region, formed in the silicon substrate and completely surrounding the first doped region; and (v) a plurality of field effect transistors of the second conductivity type formed in the fourth doped region and interconnected to provide a photocurrent sensor for measuring first, second and third photocurrents across the first, second and third photodiodes, respectively;

(b) for each row in said matrix, row select circuitry connected to each of the color photosensor structures in said row for selectively designating for outputting output signals representative of the first, second and third photocurrents generated in color photosensor structures in said row; and (c) for each column in said matrix, column output circuitry connected to each of the color photosensor structures in said column for selectively outputting output signals representative of the first, second and third photocurrents generated in color photosensor structures in said column.

* * * * *